US011381093B1

(12) United States Patent
Cooper

(10) Patent No.: US 11,381,093 B1
(45) Date of Patent: Jul. 5, 2022

(54) BATTERY LOCKOUT OVERRIDE LOGIC FOR A BATTERY MANAGEMENT SYSTEM

(71) Applicant: Green Cubes Technology, LLC, Kokomo, IN (US)

(72) Inventor: Anthony H. Cooper, Kokomo, IN (US)

(73) Assignee: Green Cubes Technology, LLC, Kokomo, IN (US)

( * ) Notice: Subject to any disclaimer, the term of this patent is extended or adjusted under 35 U.S.C. 154(b) by 174 days.

(21) Appl. No.: 16/692,416

(22) Filed: Nov. 22, 2019

Related U.S. Application Data

(60) Provisional application No. 62/770,771, filed on Nov. 22, 2018.

(51) Int. Cl.
*H02J 7/00* (2006.01)
*G01R 31/3842* (2019.01)
*H01M 10/48* (2006.01)
*H01M 10/44* (2006.01)

(52) U.S. Cl.
CPC ........ *H02J 7/0021* (2013.01); *G01R 31/3842* (2019.01); *H01M 10/441* (2013.01); *H01M 10/482* (2013.01)

(58) Field of Classification Search
USPC ........................................................ 320/116
See application file for complete search history.

(56) References Cited

U.S. PATENT DOCUMENTS

| | | | |
|---|---|---|---|
| 2012/0299531 A1* | 11/2012 | Prosser | B60L 53/57 320/104 |
| 2016/0141907 A1* | 5/2016 | Mulawski | H02J 9/061 320/107 |
| 2017/0264123 A1* | 9/2017 | Mulawski | H02J 7/00714 |

* cited by examiner

*Primary Examiner* — Mohammed Alam
(74) *Attorney, Agent, or Firm* — Reichel Stohry Dean LLP; Mark C. Reichel; Natalie J. Dean

(57) ABSTRACT

Disclosed herein are battery management systems and methods for activating battery override logic for a battery management system to provide a power path to a battery pack. A method of activating battery override logic for a battery management system may comprise detecting a predetermined key toggle sequence performed in a predetermined amount of time or detecting an override message received from a CAN bus. The method may further comprise determining if the last override turn-on sequence was requested more than a predetermined amount of time ago, confirming that the override is configured for the contactor, and turning on the contactor to provide a power path to the battery pack for a limited predetermined amount of time. An exemplary predetermined toggle sequence may comprise on-off-on-off-on performed within 10 seconds. An exemplary override message from the CAN bus may be initiated by a user having a key, code, or access card.

19 Claims, 2 Drawing Sheets

BATTERY LOCKOUT OVERRIDE LOGIC FOR A BATTERY MANAGEMENT SYSTEM

PRIORITY

The present application is related to, and claims the priority benefit of U.S. Provisional Patent Application Ser. No. 62/770,771, filed on Nov. 22, 2018, the contents of which are incorporated into the present disclosure directly and by reference in their entirety.

BACKGROUND

Lithium battery systems have battery management systems (BMS) which monitor the battery usage and charge state of the battery pack. The BMS will shut off the power path to the battery pack by opening a contactor when the battery pack charge is very low, or when there are other problems with the battery pack, such as overheating, etc. Shutting off the power path to the battery pack can sometimes leave the equipment (utilizing the battery pack) stranded in poor locations, such as far away battery chargers, which are needed to get the battery charged and thus, the equipment operating again.

In the past, when equipment ran out of battery power at an undesirable location, far away from a battery charger, the equipment would need to be towed back to the maintenance area, or a spare battery would need to be called for and then driven out to the equipment, or a remote battery charger may have been called for and then driven out to the equipment, or BMS lockout may have been manually overridden by using special software to change the BMS operation, but all of these alternative options to get the equipment running again took a lot of time and effort, which resulted in lost profits.

It would thus be desirable to add control logic to the BMS, to allow the user to manually override the BMS shut down for a short, monitored period of time, to allow the equipment to be returned to the charger or maintenance area as needed. This avoids the problem of leaving large, bulky, or heavy equipment stranded in an undesirable location far away from the battery charging area.

BRIEF SUMMARY

A first embodiment of a method of activating battery override logic for a battery management system to provide a power path to a battery pack, comprises detecting a predetermined key toggle sequence or detecting an override message received from a CAN bus; determining that the last override turn-on sequence was requested more than a predetermined amount of time ago; confirming that the override is configured for the contactor; and turning on the contactor to provide a power path to the battery pack for a limited predetermined amount of time.

A second embodiment of a method of deactivating battery override logic for a battery management system to shut down a power path to a battery pack, comprises determining if battery override logic has been on for more than a predetermined amount of time, or determining if discharge current is more than a predetermined value, or determining if charge current is more than a predetermined value; and turning off the contactor to shut down the power path to the battery pack if any one of the three determinations has been met.

A first embodiment of a battery management system for activating battery override logic to provide a power path to a battery pack, wherein the battery management system comprises override control logic configured to detect a predetermined key toggle sequence or detect an override message received from a CAN bus; determine that the last override turn-on sequence was requested more than a predetermined amount of time ago; and confirm that the override is configured for a contactor; and a battery pack operably coupled to the contactor, wherein when the override control logic is configured for the contactor, the contactor is configured to provide a power path to the battery pack for a limited predetermined amount of time.

BRIEF DESCRIPTION OF THE DRAWINGS

The disclosed embodiments and other features, advantages, and disclosures contained herein, and the matter of attaining them, will become apparent and the present disclosure will be better understood by reference to the following description of various exemplary embodiments of the present disclosure taken in conjunction with the accompanying drawings, wherein.

Figure 1:
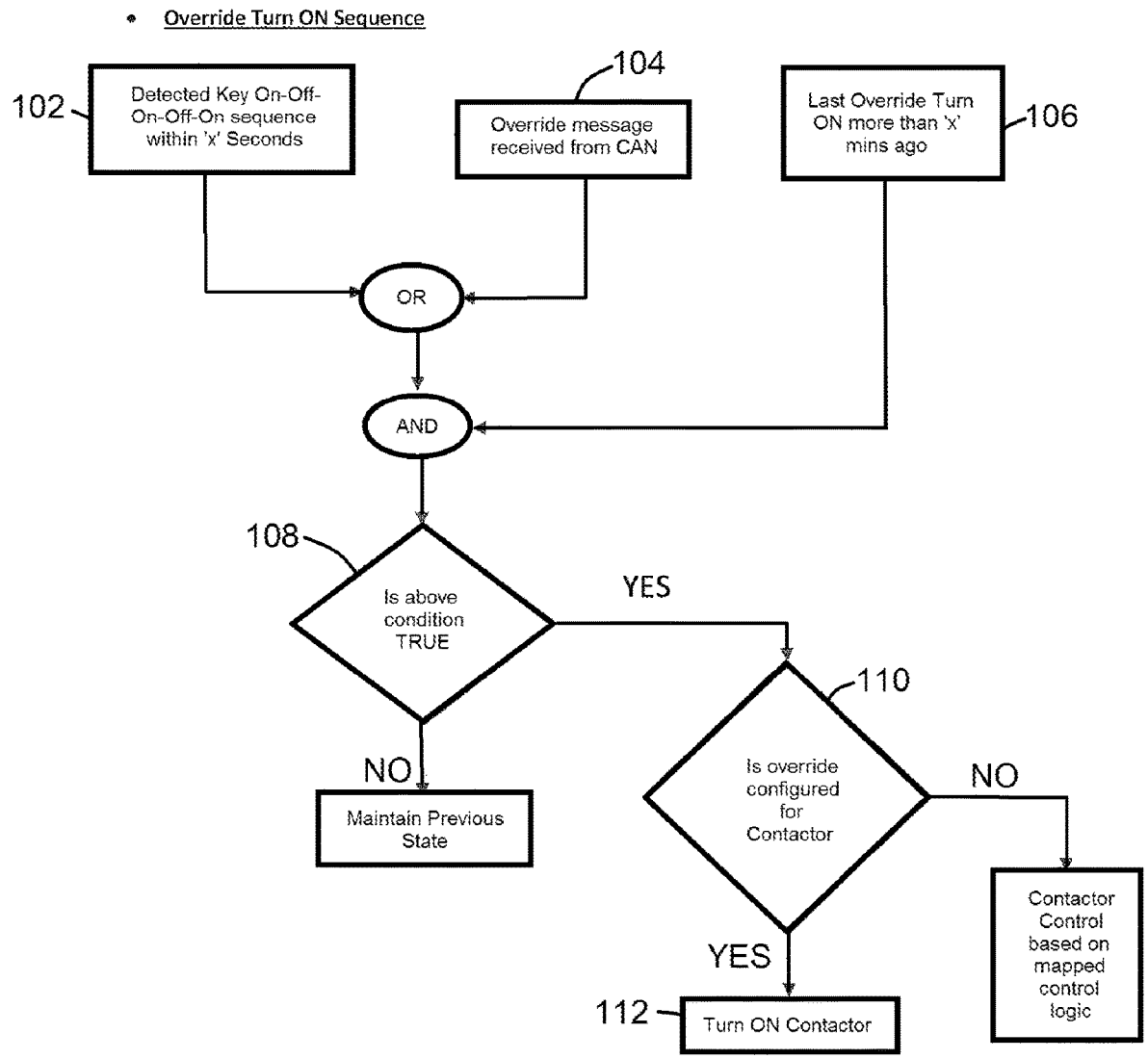
FIG. 1 illustrates a flowchart for the battery override logic operating in a "turn ON" sequence.

As such, an overview of the features, functions and/or configurations of the components depicted in the various figures will now be presented. It should be appreciated that not all of the features of the components of the figures are necessarily described and some of these non-discussed features (as well as discussed features) are inherent from the figures themselves. Other non-discussed features may be inherent in component geometry and/or configuration. Furthermore, wherever feasible and convenient, like reference numerals are used in the figures and the description to refer to the same or like parts or steps. The figures are in a simplified form and not to precise scale.

DETAILED DESCRIPTION

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

The present disclosure includes various battery control logic operations for battery management systems (BMS), and methods and sequences of turning the battery control logic on and off. The battery override logic taught herein allows a user to manually override the BMS shut down for a short, monitored period of time, to provide a limited amount of power to the battery pack so that the equipment can be returned to the charger or maintenance area as needed. This battery override logic is intended to efficiently aid employees in operating large equipment (such as cranes, jacks, forklifts, etc.) utilizing BMS, such as in larger fulfillment warehouse operations etc., to prevent leaving large equipment stranded in undesirable locations or far away from battery chargers.

Lithium battery systems have battery management systems (BMS) which monitor the battery usage and/or charge state of the battery pack. If a battery pack becomes overly discharged (i.e., very low battery), the BMS will shut off the power output to protect the battery pack from damage. Similarly, if the battery pack is overly charged (i.e., battery becomes too charged), then the BMS will also shut down the charge path to protect the battery pack from damage. Additionally, the BMS may also shut down the power path to the battery pack due to other detected conditions, such as temperature limits, cell imbalances, shock level, communication issues, or possible internal BMS errors. When the battery power path is shut down, for any of these reasons, it can strand the equipment in poor locations, cause disruptions in the work flow, or possibly leave equipment in dangerous locations.

To eliminate the need for outside/maintenance support to get the equipment moving again, the BMS has been designed to incorporate battery control override logic which will allow the battery power shut down to be "overridden," allowing a "limp home" mode of operation of the battery pack. This "limp home" mode may provide a limited amount of battery power, at a reduced current, for a limited or predetermined amount of time, to allow the equipment to be moved to a better location for charging or maintenance.

The BMS may detect a request for the battery override logic in several ways. The BMS may detect an override request by sensing multiple key sequence toggles (such as on-off-on-off-on) of the battery power switch in a predefined period of time, such as within 10 seconds, or may receive a request for override sent via a serial bus communication or CAN bus, for example. The request for override from the CAN bus, may be done manually, such as by entering a predetermined code, key, or access card, for example. Additionally, the battery override logic may also verify that the last override request was performed more than 30 minutes ago, to prevent the override logic from being used multiple times in a row, thus preventing damage to the battery pack. When the battery override logic request is received, the BMS will close the power contactor, allowing the battery's power path or contactor to flow to the equipment for just a few more minutes, thus providing battery power to the equipment for the limited time period in a "limp home" mode. However, in the "limp home" or limited mode of operation, the BMS may also set a timer to only allow power output for a programmable or predetermined amount of time, such as 2 minutes, for example, to prevent any major or permanent damage to the battery pack.

Additionally, the battery override logic may allow only a reduced current output as compared to normal current output/operation. For example, the battery override logic may only allow a reduced current of 50 amps, as compared to a normal current of 200 amps supplied to the battery pack, or a predetermined percentage of only 25% of normal operating current. These predetermined parameters are exemplary only for the purposes of illustration herein and of course, other currents or percentages of operating current may be used herein. These predetermined parameters can also be preprogrammed, depending on the type or size of battery pack and the type of equipment. In addition, the allowed current level output and times can be predetermined or preprogrammed depending upon the reason for the override. For example, depending upon if the override is for battery pack overcharge, or over discharge (i.e. very low battery), the allowed current level and times can be predetermined and preprogrammed to help prevent any major or permanent damage to the battery pack, while still allowing a few extra minutes of operating power (i.e., power path to the battery) to safely return the equipment to a move convenient area or battery charging location.

For example, a forklift driver may continue to operate his forklift (i.e., equipment utilizing a battery pack) after the battery discharge indicator (aka BDI) reflects a low battery. In this case, the forklift driver has discharged the lithium battery below the low voltage threshold to the point where the BMS shuts off the battery to protect against damage. Once the power to the battery pack is shut off, the forklift is now stranded away from the charging area or maintenance area and can no longer move. In this case, maintenance can then operate the battery override logic taught herein to allow enough current and power to flow to the battery to drive the forklift back to the charger.

FIG. 1 is a flowchart 100 illustrating the battery override logic when the override is being activated, or operating in the "turn ON" sequence. As shown in the flowchart 100, the battery override logic turn ON sequence can begin by detecting 102 a key toggle, such as an on-off-on-off-on sequence within a predefined period of time (such as "x" minutes of time). Alternatively, the battery override logic turn ON sequence can also begin by detecting 104 an override message received from a serial bus connector, or CAN bus. If either condition 102 or 104 is detected/received, and the last override turn ON 106 was more than a predetermined number of minutes ago (such as "x" minutes ago), then the next step of flowchart 100 will ask if the above condition is true 108. If the above condition 108 is not true (i.e., "no" as shown in flowchart 100), then the override logic will not turn on the contactor and the battery pack will remain in its previous or shut off state. If the above condition 108 IS true (i.e., "yes" as shown on flowchart 100), then the next step will be to determine 110 if the override is configured for the contactor. If the override is not configured for the contactor (i.e., "no" as shown on flowchart 100) then the contactor control will be based upon mapped or predetermined control logic. If the override is configured for the contactor (i.e., "yes" on the flowchart 100) then the contactor will be turned on to provide a power path to the battery, as show at final step 112.

Figure 2:
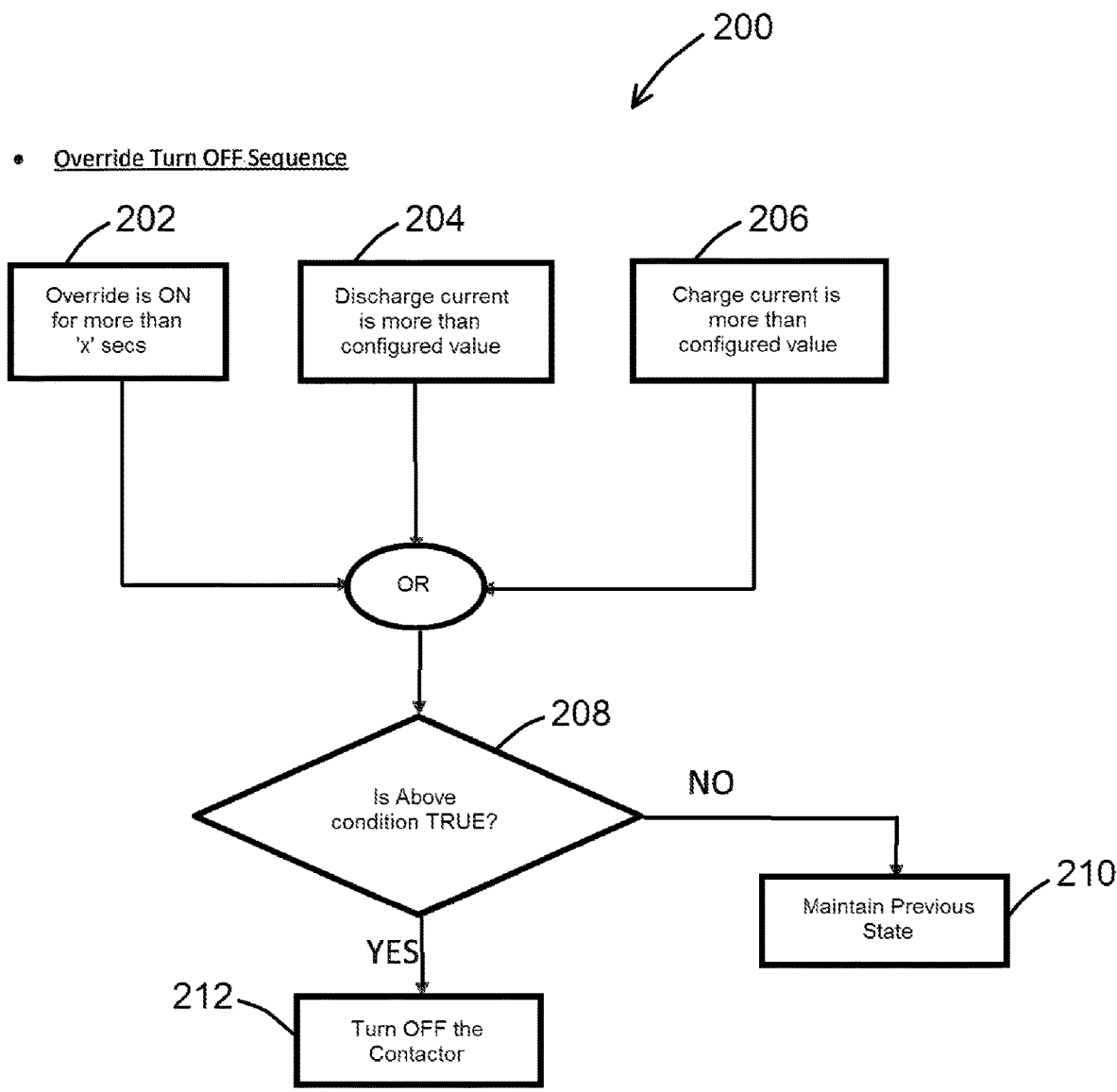
FIG. 2 illustrates a flowchart for the battery override logic operating in a "turn OFF" sequence.

FIG. 2 is a flowchart 200 illustrating the battery override logic when the override is operating in the "turn OFF" sequence. As shown in the flowchart 200, the battery override logic turn OFF sequence can begin under three different conditions 202, 204, and/or 206. The battery override logic turn OFF sequence can begin if: 1) the override is on for more than a predetermined amount of time (such as "x" seconds or minutes) 202; 2) the discharge current is more than a predetermined configured value 204; and/or 3) if the charge current is more than a predetermined configured value 206. If any of the three conditions 202, 204, and/or 206 is NOT true 208 (i.e., "no" as shown on flowchart 200), then the battery and contactor will remain in its previous state 210. If any of the three conditions 202, 204, and/or 206 IS true (i.e., "yes" as shown on flowchart 200), then the contactor will be turned off 212 and thus, the power path to the battery pack will be turned off.

While various embodiments of devices and systems and methods for using the same have been described in considerable detail herein, the embodiments are merely offered as non-limiting examples of the disclosure described herein. It will therefore be understood that various changes and modifications may be made, and equivalents may be substituted for elements thereof, without departing from the scope of the present disclosure. The present disclosure is not intended to be exhaustive or limiting with respect to the content thereof.

Further, in describing representative embodiments, the present disclosure may have presented a method and/or a process as a particular sequence of steps. However, to the extent that the method or process does not rely on the particular order of steps set forth therein, the method or process should not be limited to the particular sequence of steps described, as other sequences of steps may be possible.

Therefore, the particular order of the steps disclosed herein should not be construed as limitations of the present disclosure. In addition, disclosure directed to a method and/or process should not be limited to the performance of their steps in the order written. Such sequences may be varied and still remain within the scope of the present disclosure.

The invention claimed is:

1. A method of activating battery override logic for a battery management system to provide a power path to a battery pack, comprising:
   detecting a predetermined key toggle sequence or detecting an override message received from a CAN bus;
   determining that the last override turn-on sequence was requested more than a predetermined amount of time ago;
   confirming that the override is configured for the contactor; and
   turning on the contactor to provide a power path to the battery pack for a limited predetermined amount of time, wherein turning on the contactor to provide a power path to the battery pack for a limited predetermined amount of time provides enough power to operate a piece of equipment during the limited predetermined amount of time to allow the piece of equipment to be moved to a safe location or battery charging area.

2. The method of claim 1, wherein the predetermined key toggle sequence is performed in a predetermined amount of time.

3. The method of claim 2, wherein the predetermined key toggle sequence is on-off-on-off-on performed within a time period of 10 seconds.

4. The method of claim 1, wherein the power path to the battery pack is at a reduced current, as compared to normal battery power path operations.

5. The method of claim 1, wherein the power path to the battery pack is at a reduced rate of 25% of a normal battery power path operations.

6. The method of claim 1, wherein determining that the last override turn-on sequence was requested more than a predetermined amount of time ago, comprises more than 30 minutes ago.

7. The method of claim 1, wherein the limited predetermined amount of time of turning on the contactor to provide a power path to the battery pack comprises two minutes.

8. The method of claim 1, wherein the override message received from the CAN bus may be done manually using a predetermined code, key, or access card.

9. A method of deactivating battery override logic for a battery management system to shut down a power path to a battery pack, comprising:
   determining if battery override logic has been on for more than a predetermined amount of time, or determining if discharge current is more than a predetermined value, or determining if charge current is more than a predetermined value; and
   turning off the contactor to shut down the power path to the battery pack if any one of the three determinations has been met,
   wherein the predetermined amount of time allows the battery pack to provide enough power to operate a piece of equipment for the predetermined amount of time to allow the piece of equipment to be moved to a safe location or battery charging area.

10. The method of claim 9, where determining if the battery override logic has been on for more than a predetermined amount of time comprises 5 minutes.

11. The method of claim 9, where determining if the battery override logic has been on for more than a predetermined amount of time comprises 2 minutes.

12. The method of claim 9, wherein determining if discharge current is more than a predetermined value comprises a discharge current value of 50 A.

13. The method of claim 9, wherein determining if charge current is more than a predetermined value comprises a charge current value of 50 A.

14. The method of claim 9, wherein turning off the contactor to shut down the power path to the battery pack prevents damage to the battery pack.

15. A battery management system for activating battery override logic to provide a power path to a battery pack, wherein the battery management system comprises:
   override control logic configured to:
      detect a predetermined key toggle sequence or detect an override message received from a CAN bus;
      determine that the last override turn-on sequence was requested more than a predetermined amount of time ago; and
      confirm that the override is configured for a contactor; and
   a battery pack operably coupled to the contactor, wherein when the override control logic is configured for the contactor, the contactor is configured to provide a power path to the battery pack for a limited predetermined amount of time, wherein configuring the contactor to provide a power path to the battery pack for a limited predetermined amount of time, provides enough power to operate a piece of equipment for a limited predetermined amount of time to allow the piece of equipment to be moved to a safe location or battery charging area.

16. The system of claim 15, wherein the predetermined key toggle sequence is performed in a predetermined amount of time.

17. The system of claim 16, wherein the predetermined key toggle sequence is on-off-on-off-on performed within a time period of 10 seconds.

18. The system of claim 15, wherein the power path to the battery pack is at a reduced current, as compared to normal battery power path operations.

19. The system of claim 15, wherein determining that the last override turn-on sequence was requested more than a predetermined amount of time ago, comprises more than 30 minutes ago.

* * * * *